(12) United States Patent
Kondo

(10) Patent No.: US 10,246,777 B2
(45) Date of Patent: Apr. 2, 2019

(54) HEATER BLOCK HAVING CONTINUOUS CONCAVITY

(71) Applicant: ASM IP HOLDING B.V., Almere (NL)

(72) Inventor: Hiroshi Kondo, Sagamihara (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/620,454

(22) Filed: Jun. 12, 2017

(65) Prior Publication Data

US 2018/0355480 A1 Dec. 13, 2018

(51) Int. Cl.
| | |
|---|---|
| *C23C 16/00* | (2006.01) |
| *C23C 16/458* | (2006.01) |
| *H01J 37/32* | (2006.01) |
| *C23C 16/455* | (2006.01) |

(52) U.S. Cl.
CPC .... *C23C 16/4586* (2013.01); *C23C 16/45536* (2013.01); *C23C 16/45544* (2013.01); *H01J 37/3244* (2013.01); *H01J 37/32082* (2013.01); *H01J 37/32724* (2013.01); *H01J 2237/334* (2013.01); *H01J 2237/3321* (2013.01)

(58) Field of Classification Search
CPC ............ C23F 1/00; C23C 16/00; C23C 16/50
See application file for complete search history.

(56) References Cited

U.S. PATENT DOCUMENTS

| | | | | |
|---|---|---|---|---|
| 5,531,835 | A | * 7/1996 | Fodor | ................. H01L 21/6831 |
| | | | | 118/500 |
| 5,810,933 | A | * 9/1998 | Mountsier | ......... H01L 21/67109 |
| | | | | 118/500 |
| D643,055 | S | 8/2011 | Takahashi | |
| 7,993,462 | B2 | 8/2011 | Takahashi | |
| 9,607,822 | B2 | * 3/2017 | Buckalew | ........... H01L 21/0273 |
| 2002/0162630 | A1 | * 11/2002 | Satoh | .................. C23C 16/4583 |
| | | | | 156/345.51 |

\* cited by examiner

*Primary Examiner* — Robert M Kunemund
(74) *Attorney, Agent, or Firm* — Pillsbury Winthrop Shaw Pittman LLP

(57) ABSTRACT

A heater block adapted to be installed in a plasma deposition or plasma etching apparatus that includes a showerhead and a reaction chamber, the heater block being adapted to be arranged in the reaction chamber to support a substrate and includes: at least one through-hole passing through the heater block, and on its upper face a plurality of surfaces separated from each other and defined by a continuous concavity; and the continuous concavity including: a plurality of main concaves or depressions, a plurality of concave channels connecting substantially every two adjacent main concaves or depressions, and a concave or depression, at the center of the heater block, of a different shape or size from the plurality of main concaves or depressions.

20 Claims, 14 Drawing Sheets

HEATER BLOCK HAVING CONTINUOUS CONCAVITY

FIELD

The present description relates generally to a heater block or workpiece support for an apparatus used in a semiconductor manufacturing process, in particular for a plasma deposition or etching apparatus.

BACKGROUND

As part of a semiconductor manufacturing process, plasma enhanced chemical vapor deposition (PECVD) and plasma enhanced atomic layer deposition (PEALD) processes are generally used to deposit film on a patterned surface of a workpiece, such as a semiconductor substrate, located on a heater block or workpiece support in the chamber. Those processes are typically accomplished by introducing a precursor gas or gas mixture into a chamber that contains a workpiece on a heater block or workpiece support. The precursor gas or gas mixture is usually directed downwardly via a shower plate located around the top of the chamber.

SUMMARY

In such a process, the heater block or workpiece support is used to support the substrate, and the surface thereof may be processed to add patterns (e.g., continuous concaves and convexes) such that convexes support the substrate and concaves do not contact the substrate such that the patterns play the role of avoiding foreign matter from being attached to the back of the substrate or preventing the substrate from sticking to the heater block or workpiece support.

Conventionally, the determination of a location of a substrate on a heater block or workpiece support is often done manually by a human-being. However, recently, the technology of automatic recognition of a location of a substrate has advanced, and detecting the location of the center of the substrate has become significant in achieving the automatic recognition of the substrate location for substrate transfer purposes.

FIG. 1 shows an overview of a heater block 11 showing an upper surface thereof. In FIG. 1, a plurality of concaves 2 of cylindrical shape are provided on the upper surface of a substrate-supporting area 17 of a heater block 11. FIG. 2 shows an enlarged view of cross section A-A' of a portion of the upper face of the heater block 11. The distance between the centers of adjacent concaves 2 is roughly constant. The heater block 11 shown in FIG. 1 has a plurality of dimple-like concaves 2 on a substrate-supporting surface 6 and the substrate-supporting surface 6 is a continuous plane. Through-holes for substrate support pins 4 are arranged irrespective of the pattern of concaves 2.

When this kind of heater block of FIG. 1 is used with the technology of automatic recognition of a location of a substrate, it is found out that as the upper surface of the heater block 11 has a similar pattern of concaves 2, it is difficult for an automatic recognition sensor to accurately measure or detect the location of a center point of a target substrate placed on the upper face of the heater block 11.

An object of an embodiment of the present invention is to provide a heater block adapted to be installed in a plasma deposition or plasma etching apparatus comprising a showerhead, a heater block and a reaction chamber, the heater block being adapted to be arranged in the reaction chamber to support a substrate and comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, and a concave or depression, at the center of the heater block, of a different shape or size from the plurality of main concaves or depressions.

In an aspect, a heater block is adapted to be installed in a plasma deposition or plasma etching apparatus comprising a showerhead, a heater block and a reaction chamber, the heater block being adapted to be arranged in the reaction chamber to support a substrate and comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, wherein a concave or depression at the center of the heater block is defined by inner sidewalls of a plurality of convexes, and the contour of outer sidewalls of the plurality of convexes has a circular or a polygonal shape.

In an embodiment, there is provided a substrate processing apparatus comprising a heater block adapted to be installed in a plasma deposition or plasma etching apparatus comprising a showerhead, a heater block and a reaction chamber, the heater block being adapted to be arranged in the reaction chamber to support a substrate and comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, and a concave or depression, at the center of the heater block, of a different shape or size from the plurality of main concaves or depressions.

In an embodiment, there is provided a processing apparatus comprising: a showerhead; a reaction chamber; and a heater block arranged in the reaction chamber, the heat block comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, and a concave or depression, at the center of the heater block, of a different shape or size from the plurality of main concaves or depressions.

For purposes of summarizing aspects of the invention and one or more advantages achieved over the related art, certain objects and advantages are described in this disclosure. Of course, it is to be understood that not necessarily all or any such objects or advantages may be achieved in accordance with any particular embodiment. Thus, for example, those skilled in the art will recognize that the invention may be embodied or carried out in a manner that achieves or optimizes one advantage or group of advantages as taught herein without necessarily achieving one or more other objects or advantages as may be taught or suggested herein. Further aspects, features and advantages of this invention will become apparent from the detailed description which follows.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

These and other features of this invention will now be described with reference to the drawings of embodiments which are intended to illustrate and not to limit the invention. The drawings are oversimplified for illustrative purposes and are not necessarily to scale.

DETAILED DESCRIPTION

Figure 1:
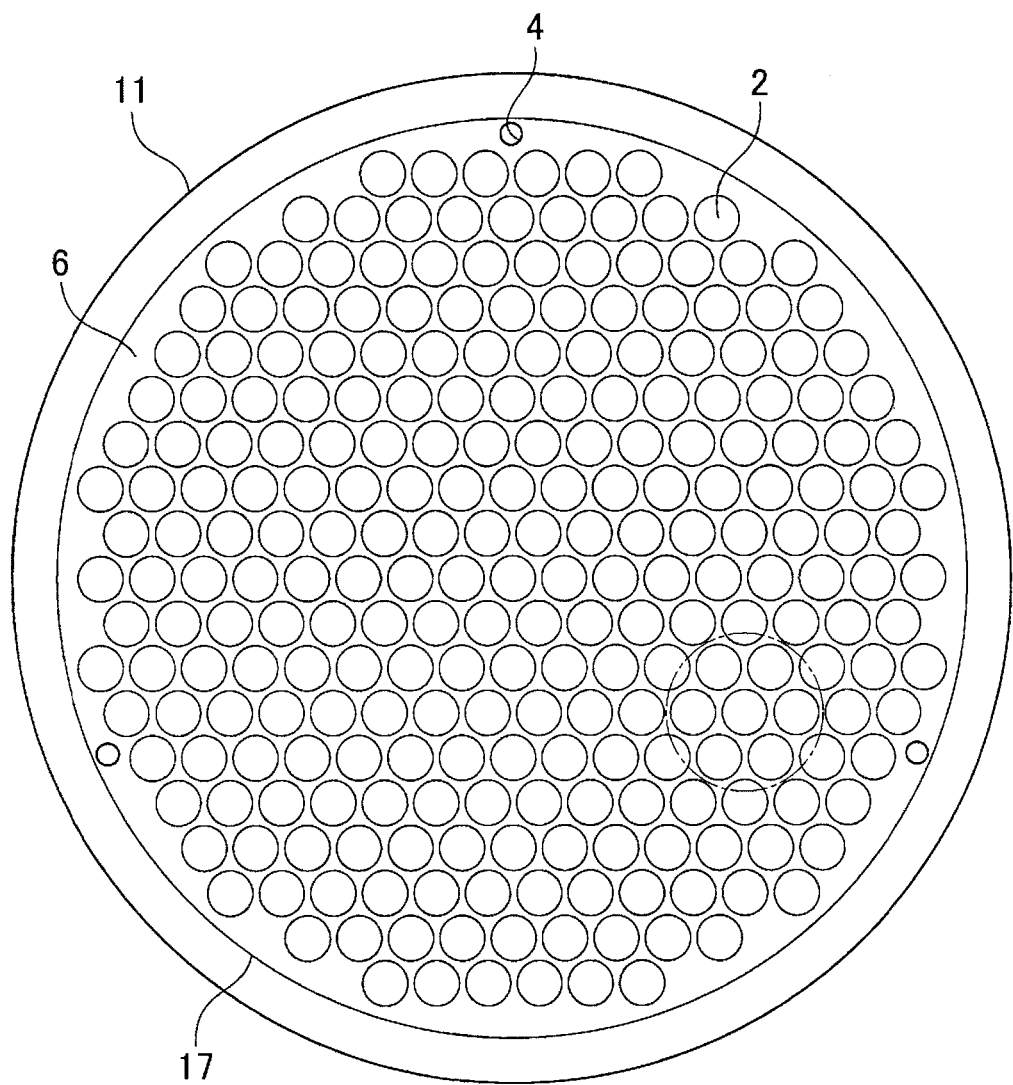
FIG. 1 is a schematic view of a heater block showing an upper face.
Figure 2:
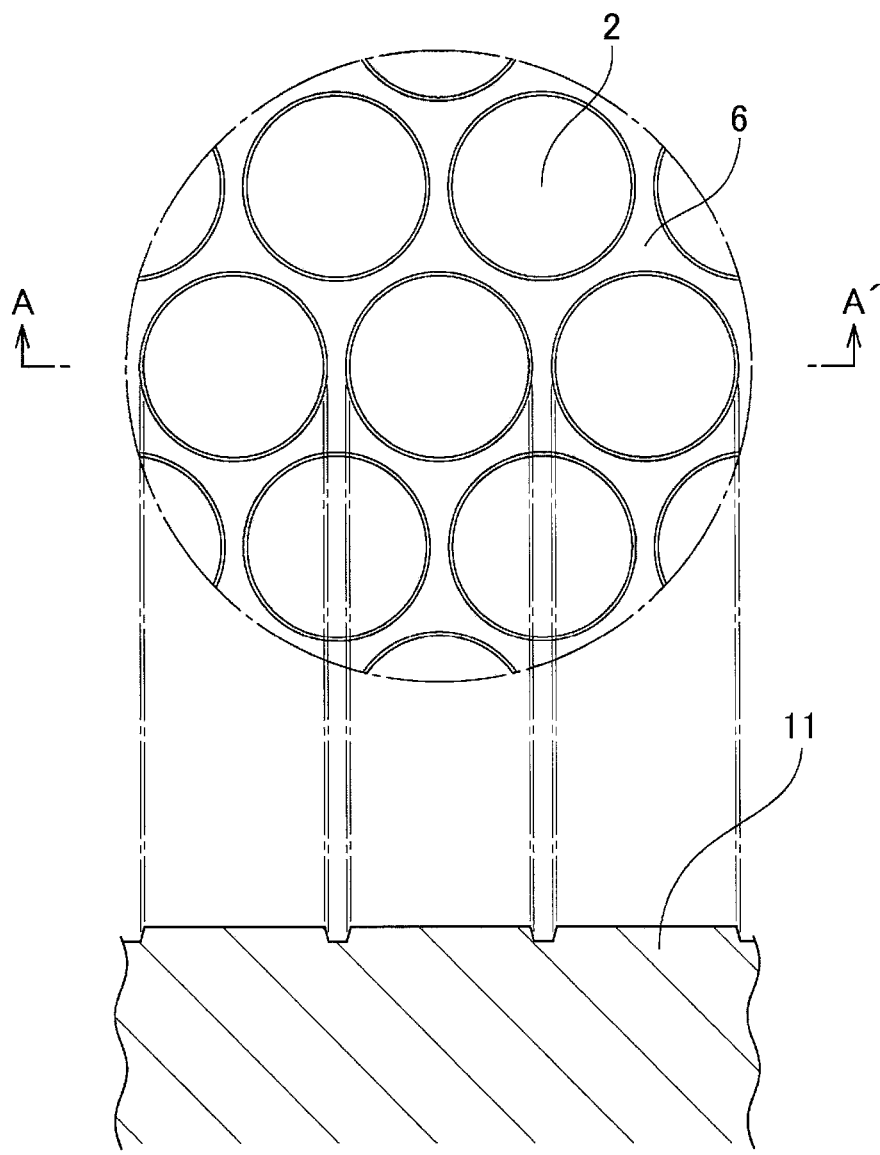
FIG. 2 is a partially enlarged schematic view of a part of the heater block of FIG. 1 showing a plurality of concaves and a substrate-supporting surface.

The present invention includes, but is not limited to, the following embodiments:

Embodiments of the present invention generally apply to a heater block, a workpiece support or a substrate-supporting device (hereinafter referred to as "a heater block") of an apparatus for performing a semiconductor manufacturing process. As an example of such manufacturing process, plasma enhanced ALD (PEALD) processes are explained to better understand how the apparatus is used to deposit film and how the heater block is used in the apparatus. Needless to say, the heater block can alternatively or additionally be used for an apparatus that performs a PECVD process. Further, embodiments of the present invention are not intended to be limited to the use in or with apparatuses performing PEALD and PECVD processes.

In PEALD processes, a workpiece (e.g., a substrate such as a semiconductor wafer) is placed in a reaction chamber and subjected to alternately repeated surface reactions. Thin SiN films are formed by repetition of a self-limiting ALD cycle. Desirably, for forming SiN films, each ALD cycle comprises at least two distinct phases. The provision and removal of a reactant from the reaction space may be considered a phase. In a first phase, a first reactant comprising silicon is provided and forms no more than about one monolayer on the workpiece surface. This reactant is also referred to herein as "the silicon precursor," "silicon-containing precursor," "halogen-containing silicon precursor" or "silicon reactant" and may be, for example, $H_2SiI_2$, $(SiI_2)(NH_2)_2$, $(SiI_2)(NHMe)_2$, $(SiI_2)(NHEt)_2$, $(SiI_2)(NH^iPr)_2$, $(SiI_2)(NH^tBu)_2$, $(SiI_2)(NMe_2)_2$, $(SiI_2)(NMeEt)_2$, $(SiI_2)(NMe^iPr)_2$, $(SiI_2)(NMe^tBu)_2$, $(SiI_2)(NEt_2)_2$, $(SiI_2)(NEt^iPr)_2$, $(SiI_2)(NEt^tBu)_2$, $(SiI_2)(N^iPr_2)_2$, $(SiI_2)(N^iPr^tBu)_2$, and $(SiI_2)(N^tBu)_2$.

In a second phase, a second reactant comprising a reactive species is provided and may convert adsorbed silicon to silicon nitride. The second reactant may comprise a nitrogen precursor. The reactive species may comprise an excited species. These reactive species from noble gases do not necessarily contribute material to the deposited film, but can in some circumstances contribute to film growth as well as help in the formation and ignition of plasma. In some embodiments, a gas that is used to form a plasma may flow constantly throughout the deposition process but only be activated intermittently.

Additional phases may be added or removed as desired to adjust the composition of the final film. One or more of the reactants may be provided with the aid of a carrier gas, such as Ar or He. The silicon precursor and the second reactant are provided with the aid of a carrier gas. Two of the phases may overlap, or be combined. For example, the silicon precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

Next, the configuration of an example embodiment of a plasma deposition apparatus is explained in detail below.

Figure 3:
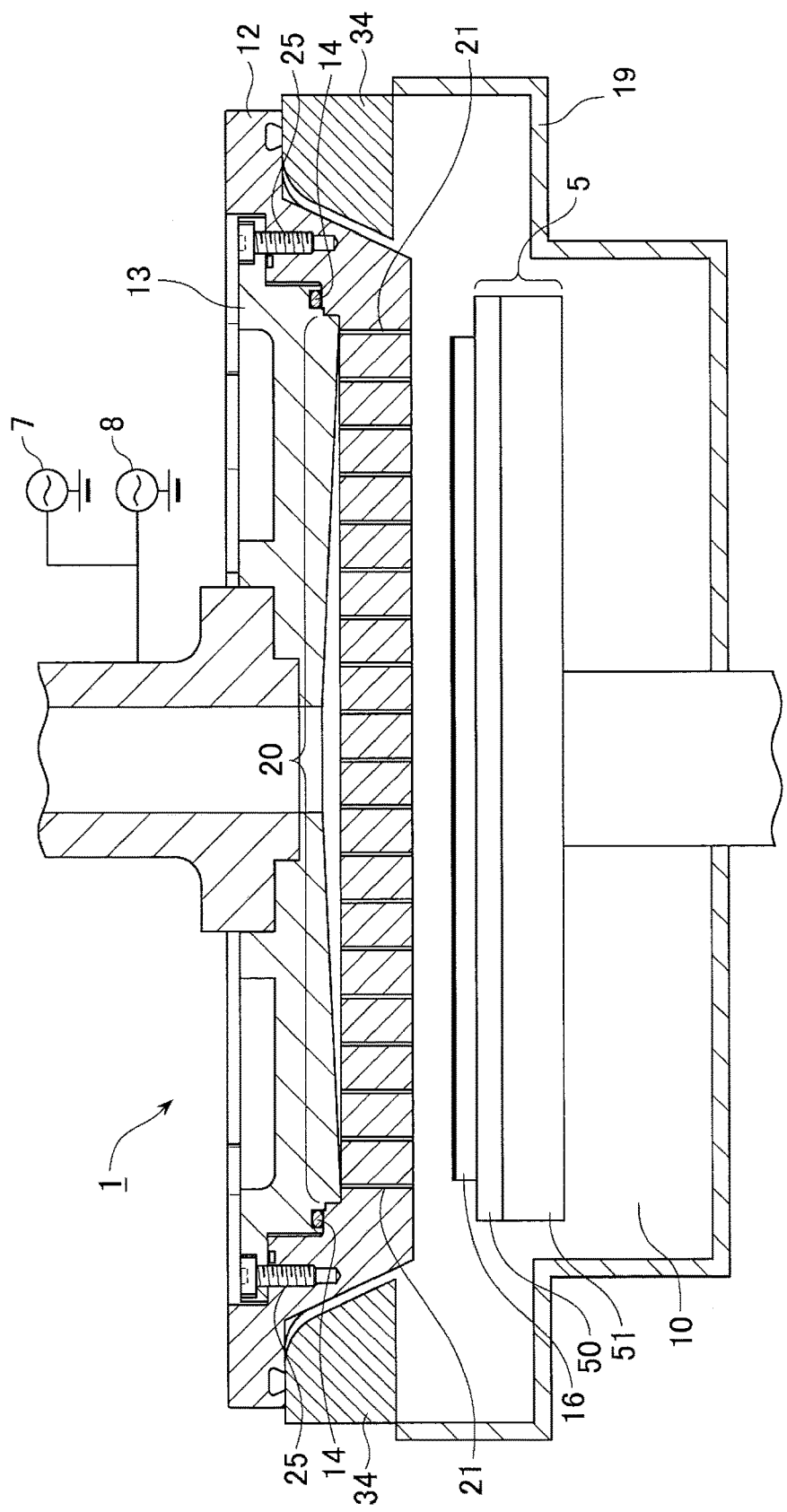
FIG. 3 is a schematic view of a PEALD apparatus comprising a heater block according to an embodiment.

As an example of the plasma deposition apparatus, FIG. 3 shows a schematic view of a PEALD apparatus 1 according to an embodiment. As shown in FIG. 3, the PEALD apparatus 1 comprises a vacuum (reaction) chamber 10 defined at least in part by a chamber wall 19, a showerhead 12 (or a shower plate 12) provided at the top of the chamber 10, and an insulator 34 provided around the showerhead 12 (which in an embodiment, forms an electrode). A heater block (or workpiece support, substrate-supporting device) 5 is provided inside the chamber 10 substantially parallel to the showerhead 12. RF power sources 7 and 8 are connected to a gas duct attached to the showerhead 12. The chamber 10 has an opening with an exhaust valve (not shown) at its side portion and comprises an exhaust duct (not shown) connected to an exhaust pump (not shown). Additionally, the chamber 10 is grounded and insulated by the insulator 34 from the showerhead 12. The chamber 10 also has an opening with a gate valve (not shown) on an inner side wall for workpiece transfer.

The showerhead 12 and a shield plate 13 are fixed to one another with one or more screws 25, and an O-ring 14 is provided between the showerhead 12 and the shield plate 13. In the showerhead 12, many gas outlet apertures 21 (holes or pores within a region 20 (e.g., circular region) of the showerhead 12) as illustrated in FIG. 3 are formed so that a jet of a source gas introduced from the gas inlet port is emitted from the apertures toward the heater block 5. The heater block 5 is composed of a susceptor 50 and a heater 51 attached to the susceptor 50 at the lower end of the heater block 5. The susceptor 50 is disposed substantially parallel to the showerhead 12, and is used to support a substrate 16 placed on its upper surface.

Automatic recognition or detection of a location of a substrate can be performed using ATS (Auto Teaching System), e.g., WaferSense™ ATS. The ATS sensor may be placed on raised transfer pins to obtain images of a target substrate on the heater block using light emitting diodes. The ATS has an advantage of recognizing circular target substrates, and can analyze the obtained images and measure the X-Y-Z offset from its own geometric center to the center of the target. The ATS can then transmits those images to a computer and display those images on its screen. The ATS can provide a real-time and accurate offset measurement. To detect offset of a target substrate, there is provided a clear mark that shows the center of the heater block so that the ATS can measure the offsets from its center to the center of a target substrate on the heater block. It is also important to ensure that this does not affect a quality of film formed on a substrate.

In one embodiment, a heater block is adapted to be installed in a plasma deposition or plasma etching apparatus comprising a showerhead, a heater block and a reaction chamber, the heater block being adapted to be arranged in the reaction chamber to support a substrate and comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, and a concave or depression, at the center of the heater block, of a different shape or size from the plurality of main concaves or depressions.

In one embodiment, a concave or depression, at the center of the heater block, has a different shape or size from the plurality of main concaves or depressions, and the concave or depression at the center of the heater block has a cylindrical shape, a reversed cone shape without tip or a polygonal columnar shape when viewed in three dimensions. In one embodiment, the concave or depression at the center of the heater block has a cylindrical shape with a diameter of between about 2 and about 20 millimeters.

In one embodiment, the concave or depression at the center of the heater block is defined by inner sidewalls of a plurality of convexes, and the contour of outer sidewalls of the plurality of convexes has a circular or a polygonal shape. In one embodiment, the plurality of main concaves or depressions and the plurality of concave channels connecting substantially every two adjacent main concaves or depressions are defined by sidewalls of a plurality of convexes. In one embodiment, a plurality of convexes that define the concave or depression at the center of the heater block has a different shape from a plurality of convexes that define the plurality of main concaves or depressions and the plurality of concave channels connecting substantially every two adjacent main concaves or depressions.

In one embodiment, a plurality of convexes that define the concave or depression at the center of the heater block has a different shape from a plurality of convexes that define the plurality of main concaves or depressions and the plurality of concave channels connecting substantially every two adjacent main concaves or depressions, and both of the plurality of convexes have sidewalls whose edges are rounded or chamfered with a radius of between about 0.1 millimeters and about 2 millimeters. If the edges of the sidewalls of the plurality of convexes can be rounded or chamfered, this means that it is possible to form each convex in one metal working process, thereby substantially reducing the formation of a burr at the edges. It was found out that the heater block with such convexes can help improve the quality of film formed on the substrate.

In one embodiment, the concave or depression at the center of the heater block are connected with adjacent main concaves via concave channels of a different shape or size from the plurality of concave channels connecting substantially every two adjacent main concaves or depressions. In one embodiment, each of the main concaves or depressions has substantially the same shape and size. In one embodiment, the at least one through-hole includes at least one through-hole used for a substrate lift pin.

In one embodiment, a heater block is adapted to be installed in a plasma deposition or plasma etching apparatus comprising a showerhead, a heater block and a reaction chamber, the heater block being adapted to be arranged in the reaction chamber to support a substrate and comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, wherein a concave or depression at the center of the heater block is defined by inner sidewalls of a plurality of convexes, and the contour of outer sidewalls of the plurality of convexes has a circular or a polygonal shape. In one embodiment, the concave or depression at the center of the heater block is connected with adjacent main concaves via concave channels of a different shape or size from the plurality of concave channels connecting substantially every two adjacent main concaves or depressions.

In one embodiment, a heater block is adapted to be installed in a plasma deposition or plasma etching apparatus comprising a showerhead, a heater block and a reaction chamber, the heater block being adapted to be arranged in the reaction chamber to support a substrate and comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, wherein a concave or depression at the center of the heater block is defined by inner sidewalls of a plurality of convexes, and the contour of outer sidewalls of the plurality of convexes has a circular or a polygonal shape.

In one embodiment, a substrate processing apparatus comprises a heater block as described herein. In one embodiment, a substrate processing apparatus comprises a heater block as described herein, wherein a plurality of main concaves or depressions, a plurality of concave channels connecting substantially every two adjacent main concaves or depressions, and a concave or depression, at the center of the heater block, of a different shape or size from the plurality of main concaves or depressions are defined by a plurality of convexes, and the substrate is supported substantially by the top face of the plurality of convexes. In one embodiment, a substrate processing apparatus comprises a heater block as described herein, wherein the heater block comprises a susceptor and a heater.

In one embodiment, a processing apparatus comprises: a showerhead; a reaction chamber; and a heater block arranged in the reaction chamber, the heat block comprising: at least one through-hole passing through the heater block, and on its upper face a plurality of surfaces separated from each other and defined by a continuous concavity; and the continuous concavity comprising: a plurality of main concaves or depressions, a plurality of concave channels connecting substantially every two adjacent main concaves or depressions, a concave or depression, at the center of the heater block, of a different shape or size from the plurality of main concaves or depressions. In one embodiment, the foregoing processing apparatus comprises a heater block whose concave or depression at the center of the heater block has a cylindrical shape, a reversed cone shape without a tip or a polygonal columnar shape when viewed in three dimensions. In one embodiment, the foregoing processing apparatus comprises a heater block whose concave or depression at the center of the heater block has a cylindrical shape with a diameter of between about 2 and about 20 millimeters.

In one embodiment, the outer periphery of the heater block is intentionally shaped in such a way that the top face of the heater block always contacts the substrate or wafer. The heater block area where a regular concave pattern has been added can be made smaller than the wafer area.

By adopting the foregoing heater block, the gases between the substrate and heater block surface (gases existing below the back of the substrate) can move along the aforementioned concave structure and flow through the through-holes when the pressure or gas flow rate in the reaction chamber changes. As a result, the heater blocks can minimize the occurrence of formation of non-uniform film thickness due to sliding over a surface of the heater block when the process conditions are changed while a film is being formed or during the purge cycle thereafter.

In an embodiment, the concave has a cylindrical shape, a reversed cone shape without a tip or a polygonal columnar shape. Its cross-sectional shape may be a triangle, square, pentagon, hexagon or other polygon or even oval, in addition to a circle. In an embodiment, the concave has a trapezoidal shape. Ideally, the main concaves should have the same size and shape and be distributed roughly uniformly over the entire top face of the heater block. The channels (or concave channels) connecting these concaves only need to link and connect the concaves and can have any longitudinal cross-section shape such as a reversed triangle, circle, or oval, in addition to a square. The depth of the channel is about the same as the concave in an embodiment, but the channel may be shallower than the concave. The width of the channel is smaller than the diameter of the concave in an embodiment. However, making the channel too shallow increases the exhaust conductance (exhaust resistance), preventing sufficient evacuation of gases and hindering the achievement of an expected anti-sliding effect.

In any of the foregoing embodiments, each of the main concaves or depressions may have substantially the same shape and size. In an embodiment, the depressed channels or concave channels may have a width smaller than a diameter of the main concaves or depressions (e.g., less than 70%). In another embodiment, the depressed channels may have a width which is nearly the same as the diameter of the main concaves or depressions. In an embodiment, the depressed channels or concave channels may have a depth which is effective to enhance gas flow in the concavity (exhaust conductance is effectively low). In an embodiment, the depth may be substantially the same as a depth of the main concaves or depressions or smaller than the depth of the main concaves or depressions (e.g., less than 70%).

Figure 4:
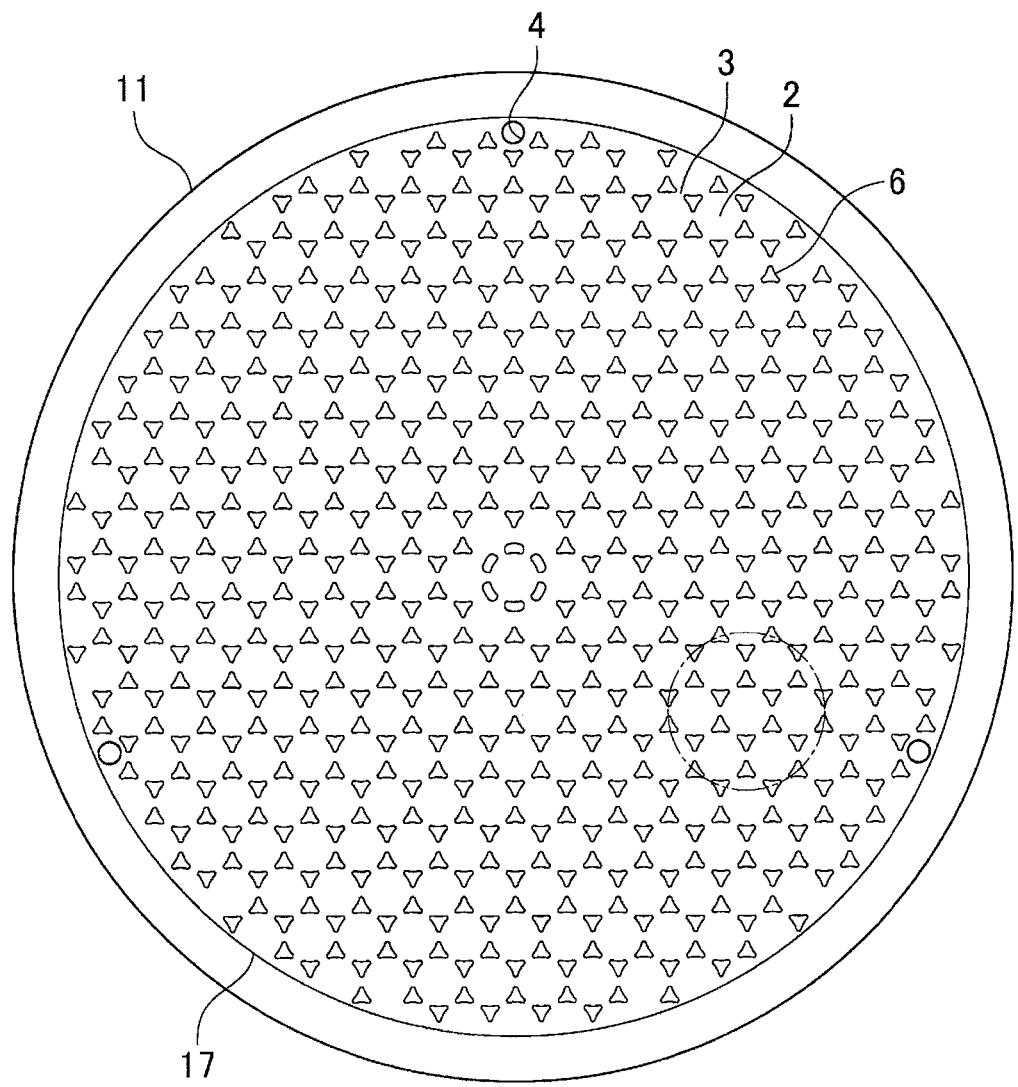
FIG. 4 is a schematic view of a heater block showing an upper face according to an embodiment.
Figure 5:
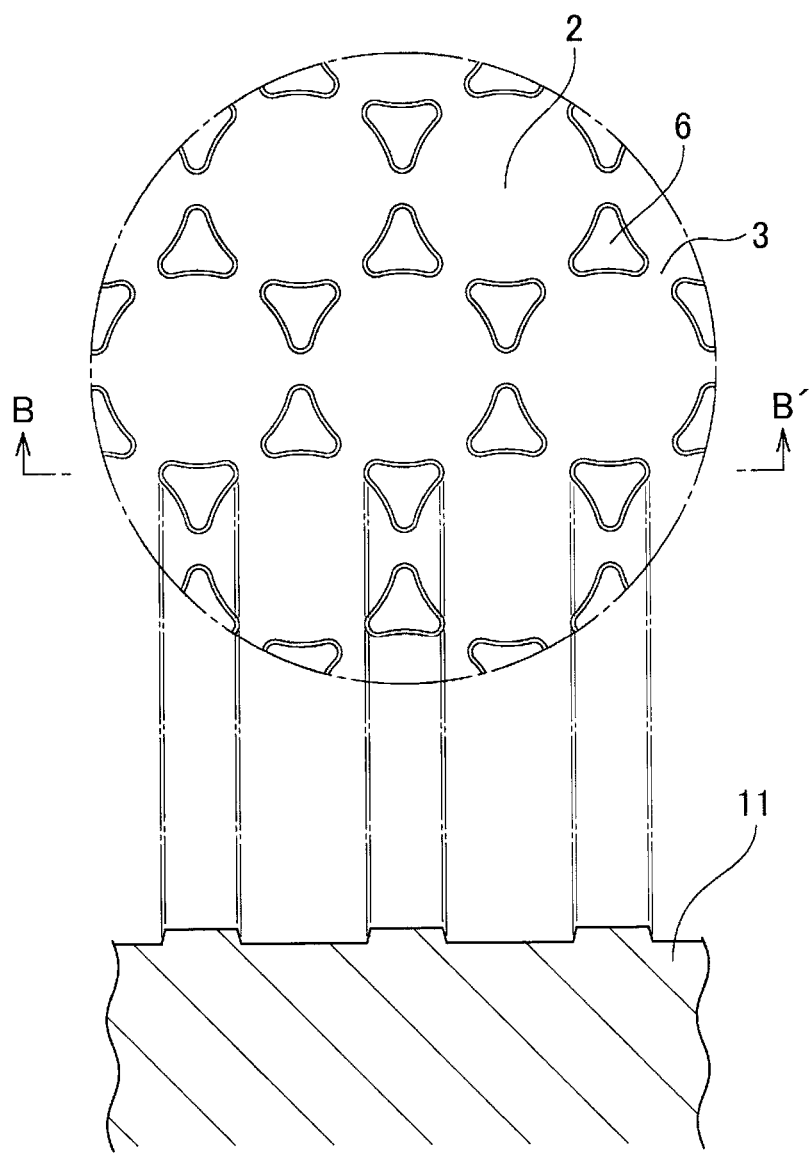
FIG. 5 is a partially enlarged schematic view of a heater block according to an embodiment showing a plurality of main concaves and a substrate-supporting surface.

FIG. 4 shows a schematic view of a heater block according to one embodiment. In FIG. 4, concaves are connected with channels and then with concaves, and holes are created around for wafer support pins passing through the substrate-supporting device. In other words, a heater block 11 shown in FIG. 4 has many concaves (main concaves) 2 in the substrate-supporting area 17 just like the one in FIG. 1, and connecting the centers of three adjacent concaves forms a regular triangle. Also, connecting the centers of six concaves adjacent to a given concave forms a regular hexagon. Each concave 2 is linked by a channel 3, and the longitudinal cross-section of the channel 3 is a rectangle. FIG. 5 shows an enlarged view of the dashed circle portion of FIG. 4 and an enlarged view of section B-B' of the heater block 11. The channels 3 make the substrate-supporting surface (convexes) 6 a discontinuous plane, or a group of isolated surfaces composed of convexes whose boundary is defined by the channels 3 and concaves 2. On the other hand, the concaves 2 also form a continuous concave structure comprising concaves connected by channels 3. The heater block shown in FIG. 4 has a single continuous concave structure connected to the through-hole for substrate support pins 4. This way, gases trapped inside the concaves can be exhausted from the closed space constituted by the back of the substrate and the heater block, through the channels connecting the concaves, when the substrate surface condition changes. As a result, sliding of the substrate on a heater block can be prevented.

Figure 6:
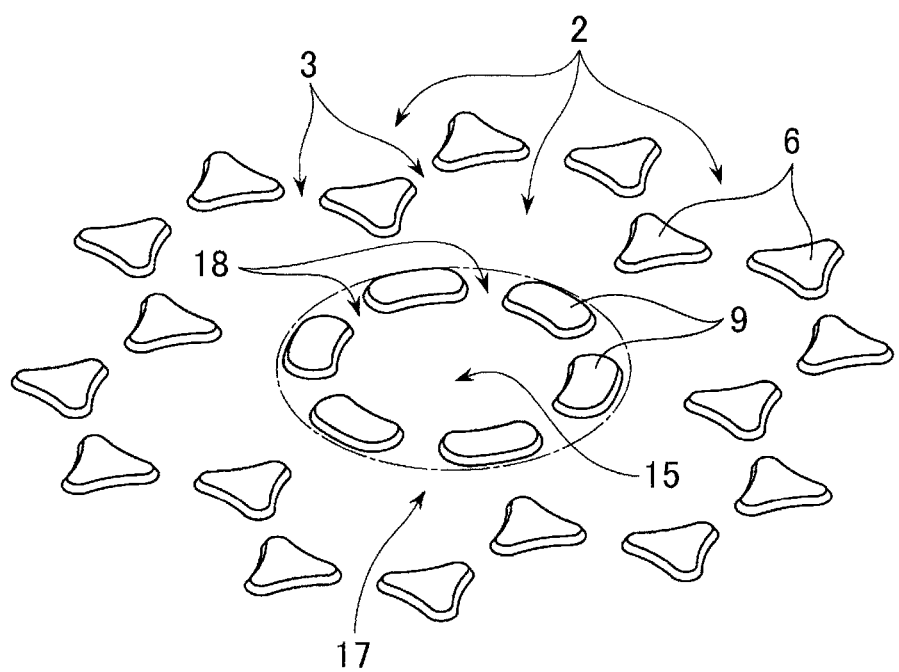
FIG. 6 is a partially enlarged schematic view of a center area of a heater block according to an embodiment.

FIG. 6 shows an enlarged perspective view of the center area of the upper face of the heater block. As also seen in FIG. 4, a center concave 15 is formed and connected with adjacent main concaves 2 through channels 3. The main concaves 2 are defined by the inner sidewalls of a plurality of convexes 6. The center concave 15 is defined by the inner sidewalls of a plurality of convexes 9. The center concave 15 is connected with adjacent main concaves 3 via concave channels 18 of a different shape or size from the plurality of concave channels 3 connecting substantially every two adjacent main concaves 3. A convex 9 has a different cross-sectional shape or size from that of a convex 6, and the contour of outer sidewalls of the convexes 9 forms substantially a shape of a circle, while outer sidewalls of the convexes 6 do not exhibit such a shape. Because of the shape of the convexes 9, the adjacent convexes 6 form a partial circle.

With these distinctive shapes (of a center concave 15 and a contour of outer sidewalls of convexes 9) formed at the center of the heater block, the ATS could recognize the center of the heater block, and detect the center of a circular target substrate so that the ATS can successfully measure the offsets from its center to the center of a target substrate on the heater block.

Also, by adopting the heater block surface configuration, gas between the substrate and heater block surface (gas existing below the back of the substrate) can still move along the aforementioned concave structure and flow through the through-holes when the pressure or gas flow rate in the reaction chamber changes.

Embodiments of the present invention will be explained in detail with reference to specific examples which are not intended to limit the present invention. The numerical numbers applied in specific examples may be modified by a range of at least ±50%, wherein the endpoints of the ranges may be included or excluded.

EXAMPLES

An embodiment of the present invention will now be explained with reference to the following examples, which is not intended to limit the scope of the present invention.

Example 1

Figure 7:
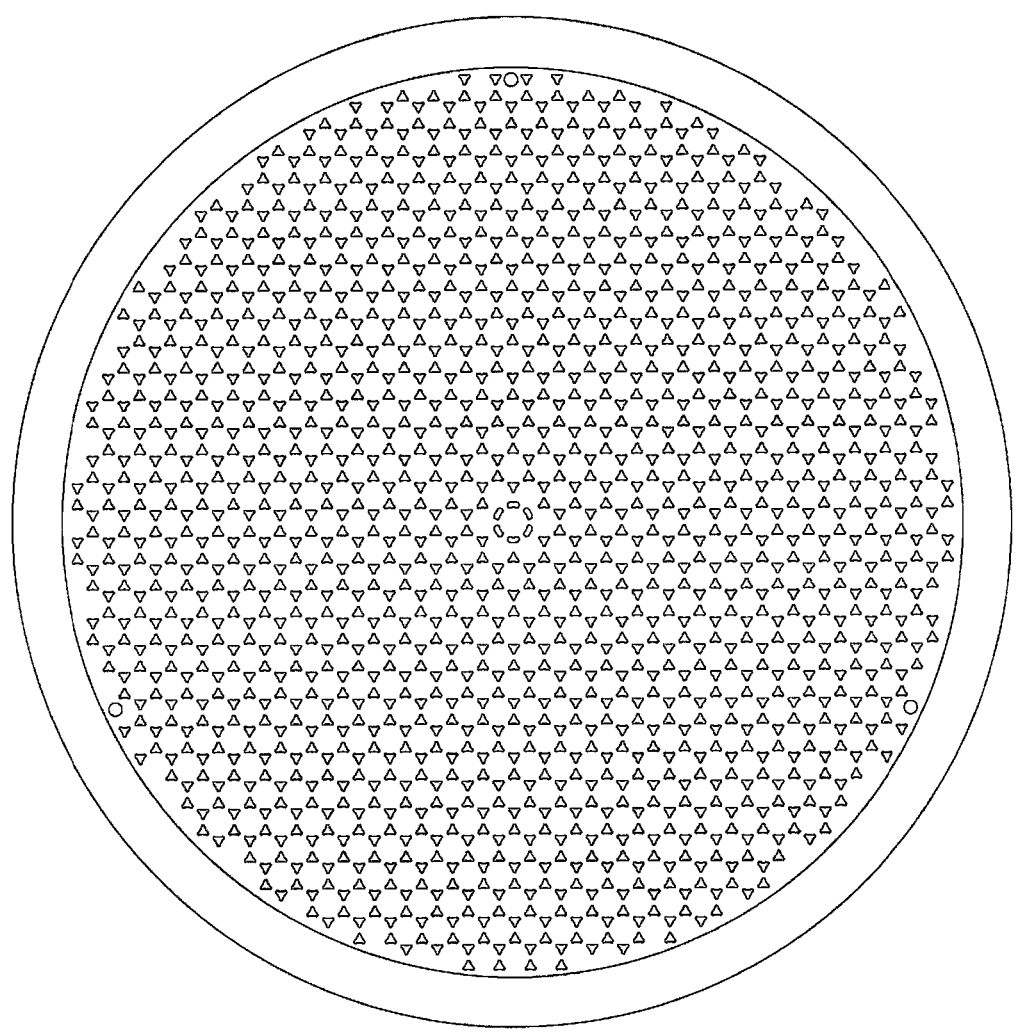
FIG. 7 is a schematic view of a heater block according to an embodiment.
Figure 8:
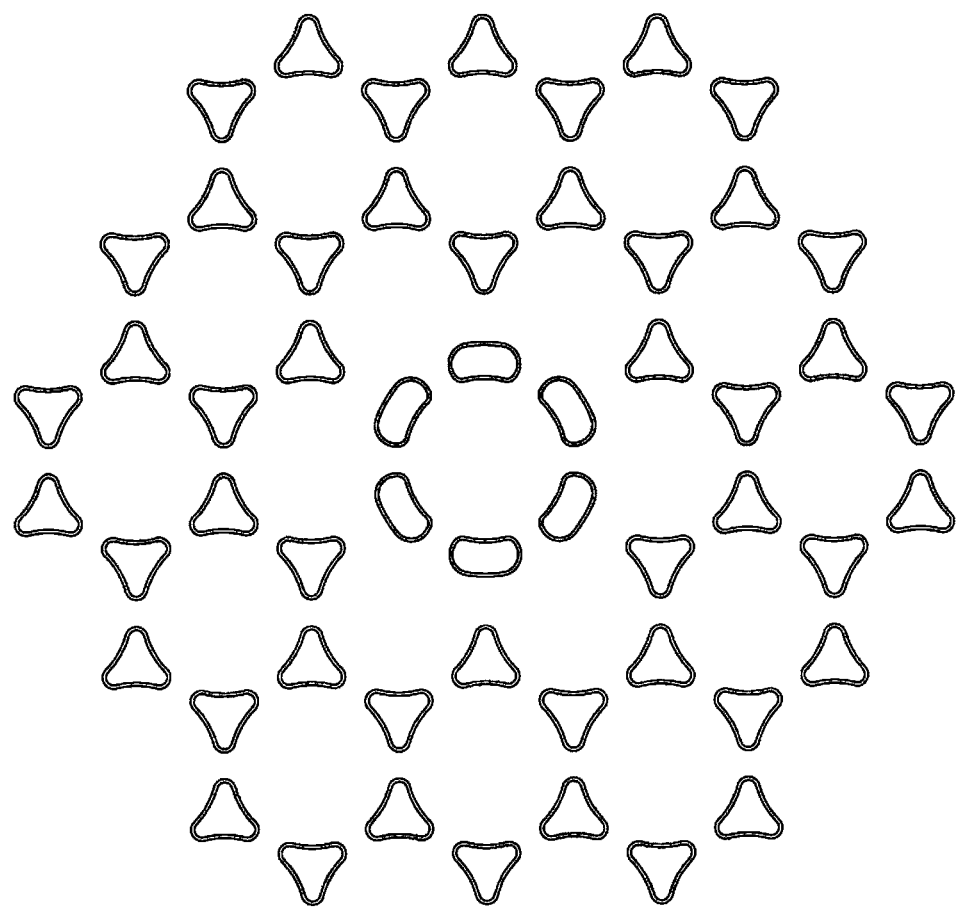
FIG. 8 is a partially enlarged schematic view of a center area of a heater block according to an embodiment.

Heater block as depicted in FIGS. 7 and 8

A schematic view of an embodiment of a heater block is shown in FIG. 7. Also, an enlarged schematic view of a center area of an embodiment of a heater block is shown in FIG. 8. The specific values used in the example are shown in parentheses.

In this example, configurations of an upper surface of a heater block are as follows:

Number of main concaves: selected from a range of about 300 to about 1000 (example: 650)

Main concave diameter: selected from a range of about 2 mm to about 20 mm (example: 9.0 mm)

Main concave depth: selected from a range of about 0.025 mm to about 15 mm (example: 0.15 mm)

Distance between main concave centers: selected from a range of about 5 mm to about 20 mm (example: 11.5 mm)

Channel width: selected from a range of about 1.0 to about 14 mm (example: 2.0 mm)

Channel depth: selected from a range of about 0.025 mm to about 15 mm (example: 0.2 mm)

Center concave diameter: selected from a range of about 2.0 to about 17 mm (example: 9.0 mm)

Center concave depth: selected from a range of about 0.025 mm to about 15 mm (example: 0.15 mm)

Shape of center concave: circular (example: circular)

Shape of contour of outer sidewalls of convexes that define center concave: circular (example: circular)

Diameter of shape of contour of outer sidewalls of convexes that define center concave: selected from a range of about 3 mm to about 25 mm (example: 13 mm)

Width of channel from the center concave: selected from a range of about 1.0 mm to about 14 mm (example: 2.0 mm)

Depth of channel from the center concave: selected from a range of about 0.025 mm to about 15 mm (example: 0.2 mm)

Heater block material: aluminum (example: aluminum)

Heater block thickness: selected from a range of about 20 mm to about 120 mm (example: 33 mm)

Heater block diameter: selected from a range of about 295 mm to about 475 mm (example: 345 mm)

In this example, the concave or depression at the center has a circular shape, and the contour of outer sidewalls of convexes that define the center concave or depressions also has a circular shape. In this way, the ATS could detect the center of a circular target substrate which has a center concave and the contour of a circular shape that functions as a clear mark that shows the center of the target substrate so that the ATS can successfully measure the offsets from its center to the center of a target substrate on the heater block. It is also confirmed that this does not affect a quality of film formed on a substrate.

Example 2

Figure 9:
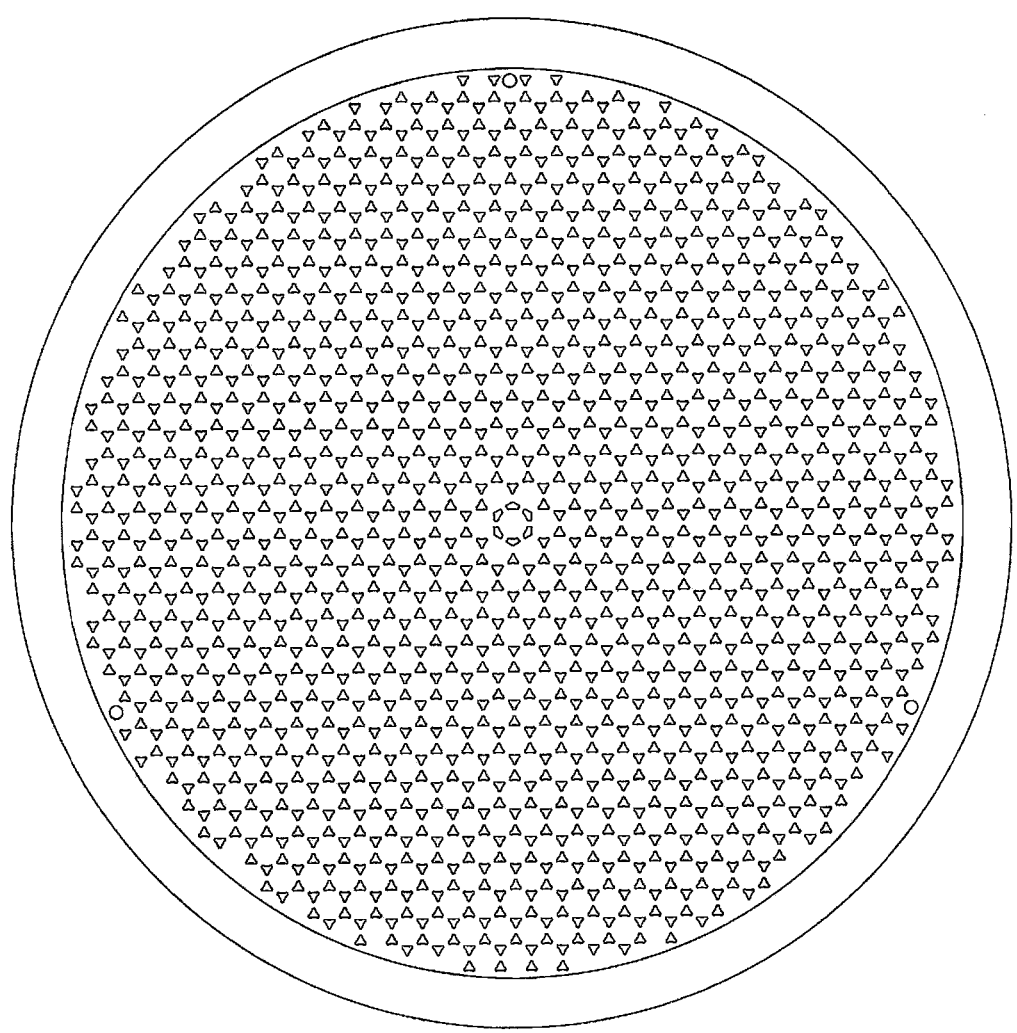
FIG. 9 is a schematic view of a heater block according to an embodiment.
Figure 10:
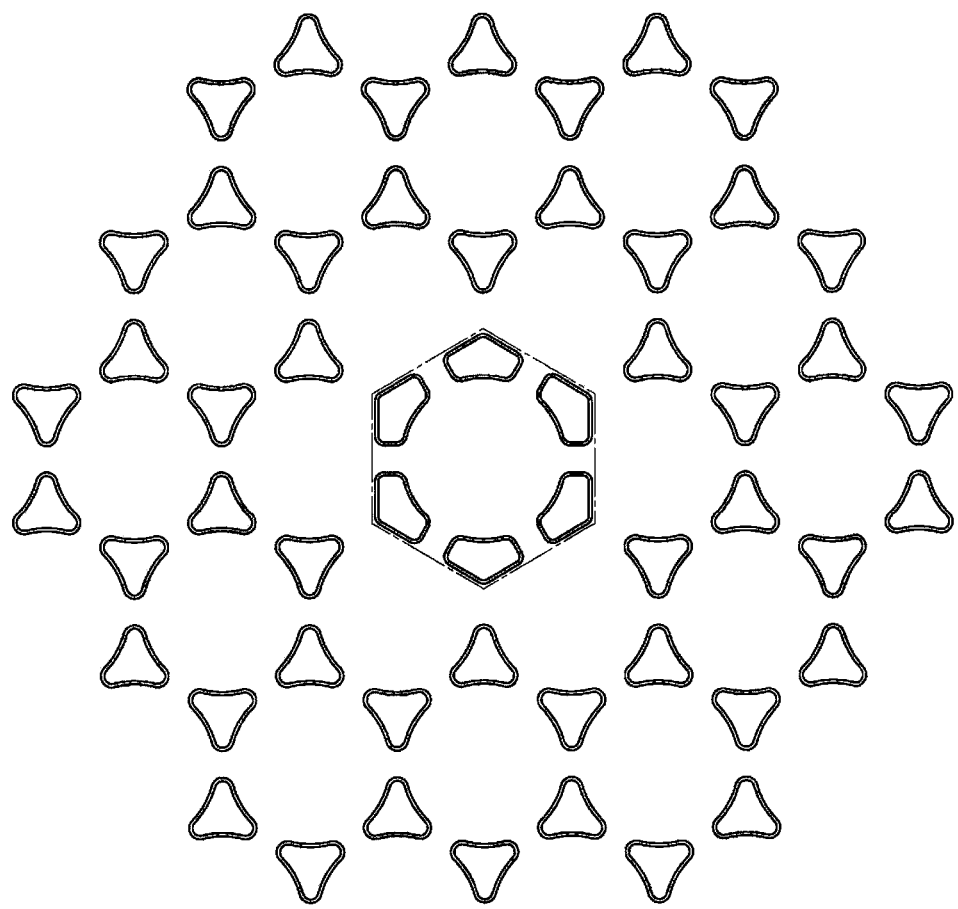
FIG. 10 is a partially enlarged schematic view of a center area of a heater block according to an embodiment.

Heater block as depicted in FIGS. 9 and 10

A schematic view of an embodiment of a heater block is shown in FIG. 9. Also, an enlarged schematic view of a center area of an embodiment of a heater block is shown in FIG. 10. The specific values used in the example are shown in parentheses.

In this example, configurations of an upper surface of a heater block are as follows:

Number of main concaves: selected from a range of about 300 to about 1000 (example: 650)

Main concave diameter: selected from a range of about 2 mm to about 20 mm (example: 9.0 mm)

Main concave depth: selected from a range of about 0.025 mm to about 15 mm (example: 0.15 mm)

Distance between main concave centers: selected from a range of about 5 mm to about 20 mm (example: 11.5 mm)

Channel width: selected from a range of about 1.0 to about 14 mm (example: 2.0 mm)

Channel depth: selected from a range of about 0.025 mm to about 15 mm (example: 0.2 mm)

Center concave diameter: selected from a range of about 2.0 to about 17 mm (example: 9.0 mm)

Center concave depth: selected from a range of about 0.025 mm to about 15 mm (example: 0.15 mm)

Shape of center concave: circular (example: circular)

Shape of contour of outer sidewalls of convexes that define center concave: polygonal (example: hexagonal)

Size of shape of contour of outer sidewalls of convexes that define center concave: selected from a range of about 3 mm to about 25 mm (example: 12 mm)

Width of channel from the center concave: selected from a range of about 1.0 mm to about 14 mm (example: 2.0 mm)

Depth of channel from the center concave: selected from a range of about 0.025 mm to about 15 mm (example: 0.2 mm)

Heater block material: aluminum (example: aluminum)

Heater block thickness: selected from a range of about 20 mm to about 120 mm (example: 45 mm)

Heater block diameter: selected from a range of about 295 mm to about 475 mm (example: 345 mm)

In this example, the concave or depression at the center has a circular shape, and the contour of outer sidewalls of convexes that define the center concave or depressions has a hexagonal shape. In this way, the ATS could also detect the center of a circular target substrate which has a center concave of a circular shape and the contour of a hexagonal shape that functions as a clear mark that shows the center of the target substrate so that the ATS can successfully measure the offsets from its center to the center of a target substrate on the heater block. It is also confirmed that this does not affect a quality of film formed on a substrate.

Example 3

Figure 11:
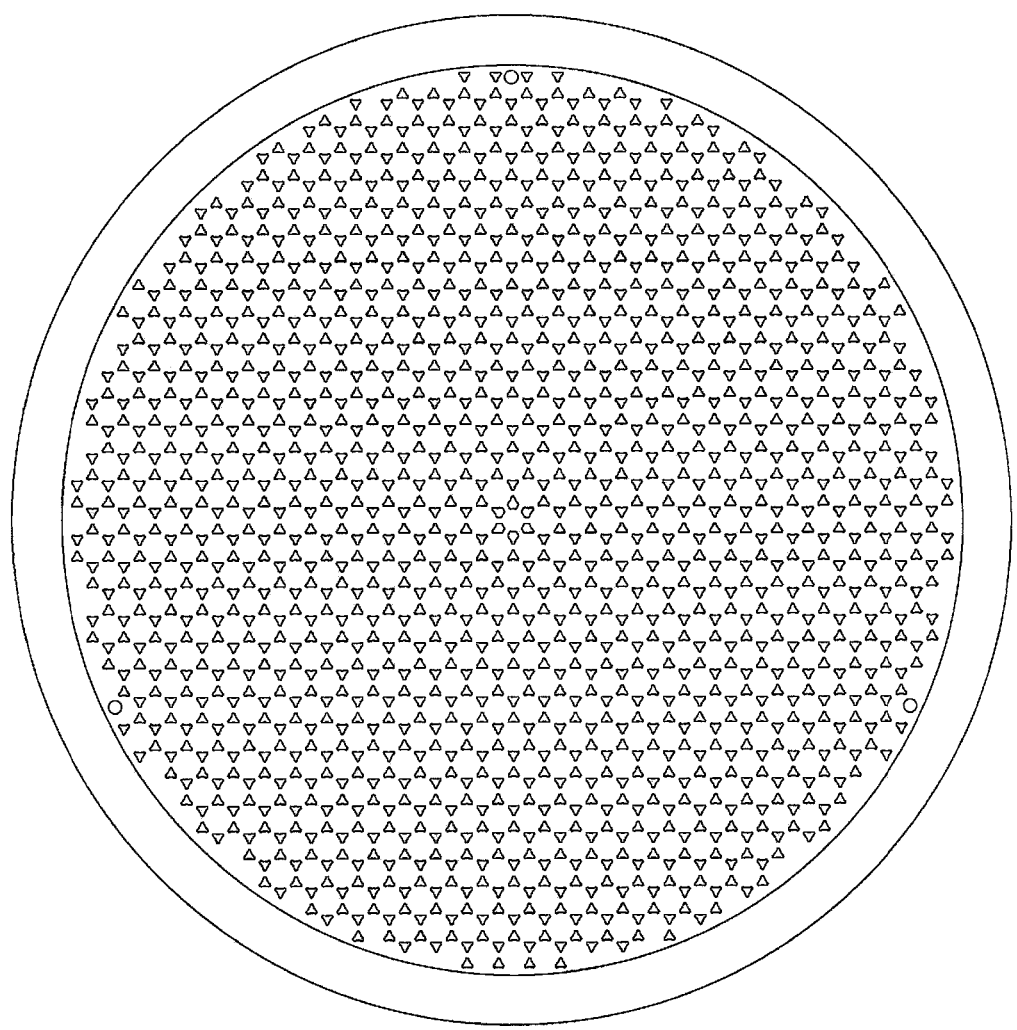
FIG. 11 is a schematic view of a heater block according to an embodiment.
Figure 12:
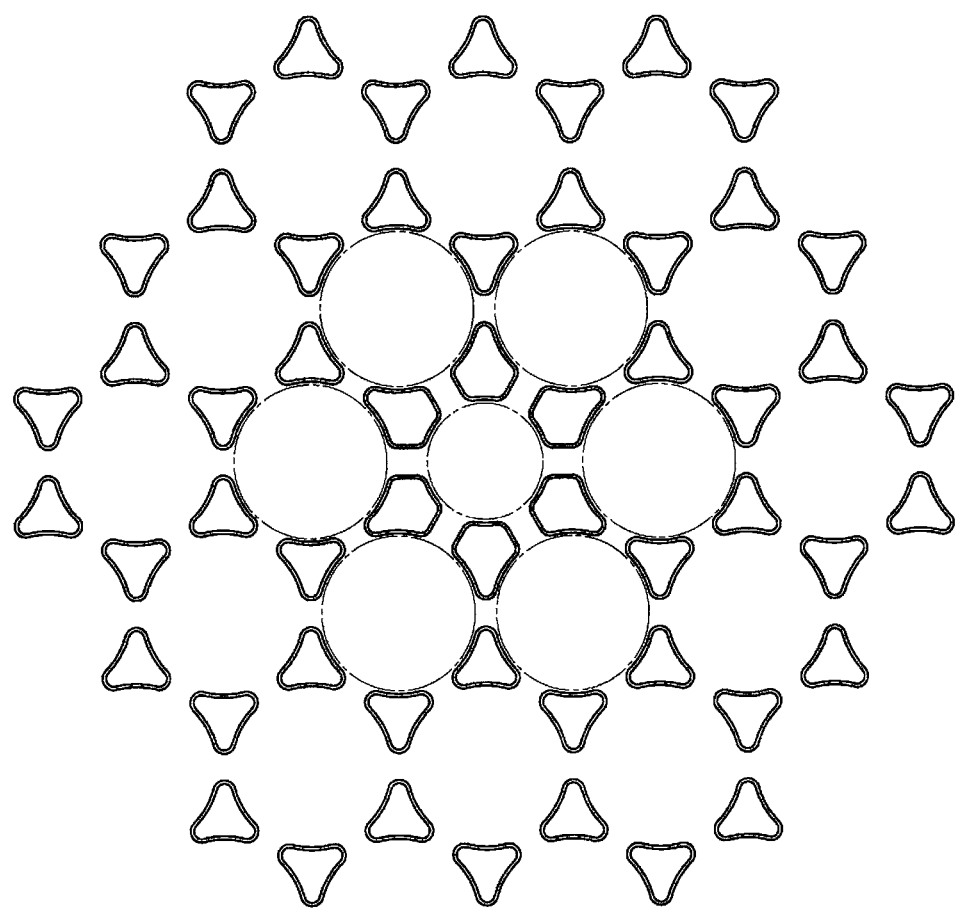
FIG. 12 is a partially enlarged schematic view of a center area of a heater block according to an embodiment.

Heater block as depicted in FIGS. 11 and 12

A schematic view of an embodiment of a heater block is shown in FIG. 11. Also, an enlarged schematic view of a center area of an embodiment of a heater block is shown in FIG. 12. The specific values used in the example are shown in parentheses.

In this example, configurations of an upper surface of a heater block are as follows:

Number of main concaves: selected from a range of about 300 to about 1000 (example: 650)

Main concave diameter: selected from a range of about 2 mm to about 20 mm (example: 9.0 mm)

Main concave depth: selected from a range of about 0.025 mm to about 15 mm (example: 0.15 mm)

Distance between main concave centers: selected from a range of about 5 mm to about 20 mm (example: 11.5 mm)

Channel width: selected from a range of about 1.0 to about 14 mm (example: 2.0 mm)

Channel depth: selected from a range of about 0.025 mm to about 15 mm (example: 0.2 mm)

Center concave diameter: selected from a range of about 2.0 to about 20 mm (example: 9.0 mm)

Center concave depth: selected from a range of about 0.025 mm to about 15 mm (example: 0.15 mm)

Shape of center concave: circular (example: circular)

Width of channel from the center concave: selected from a range of about 1.0 mm to about 14 mm (example: 2.0 mm)

Depth of channel from the center concave: selected from a range of about 0.025 mm to about 15 mm (example: 0.2 mm)

Heater block material: aluminum (example: aluminum)

Heater block thickness: selected from a range of about 20 mm to about 120 mm (example: 45 mm)

Heater block diameter: selected from a range of about 295 mm to about 475 mm (example: 345 mm)

In this example, the concave or depression at the center has a circular shape with a smaller diameter than that of the main concaves or depressions. In this way, the ATS could detect the center of a circular target substrate which has a center concave of a smaller circular shape that functions as a clear mark that shows the center of the target substrate so that the ATS can successfully measure the offsets from its center to the center of a target substrate on the heater block. It is also confirmed that this does not affect a quality of film formed on a substrate.

Example 4

Figure 13:
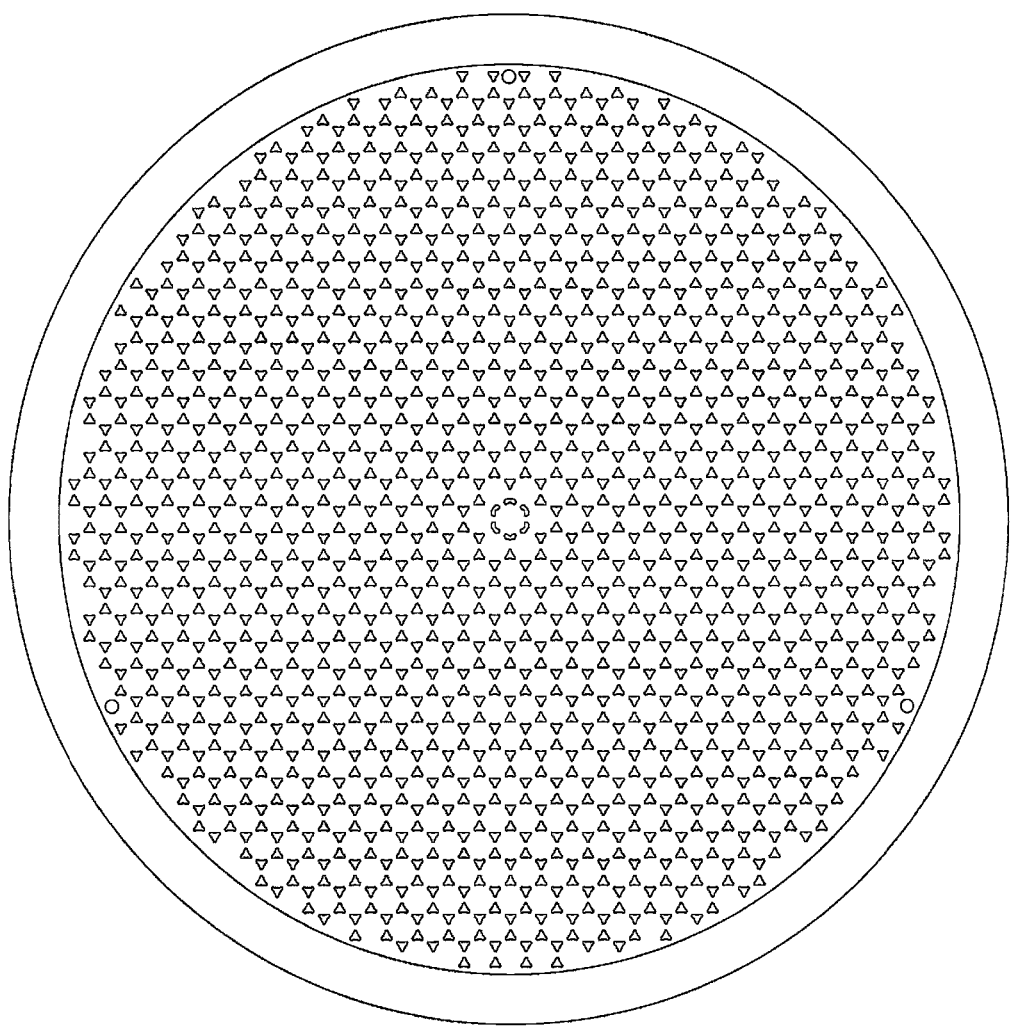
FIG. 13 is a schematic view of a heater block according to an embodiment.
Figure 14:
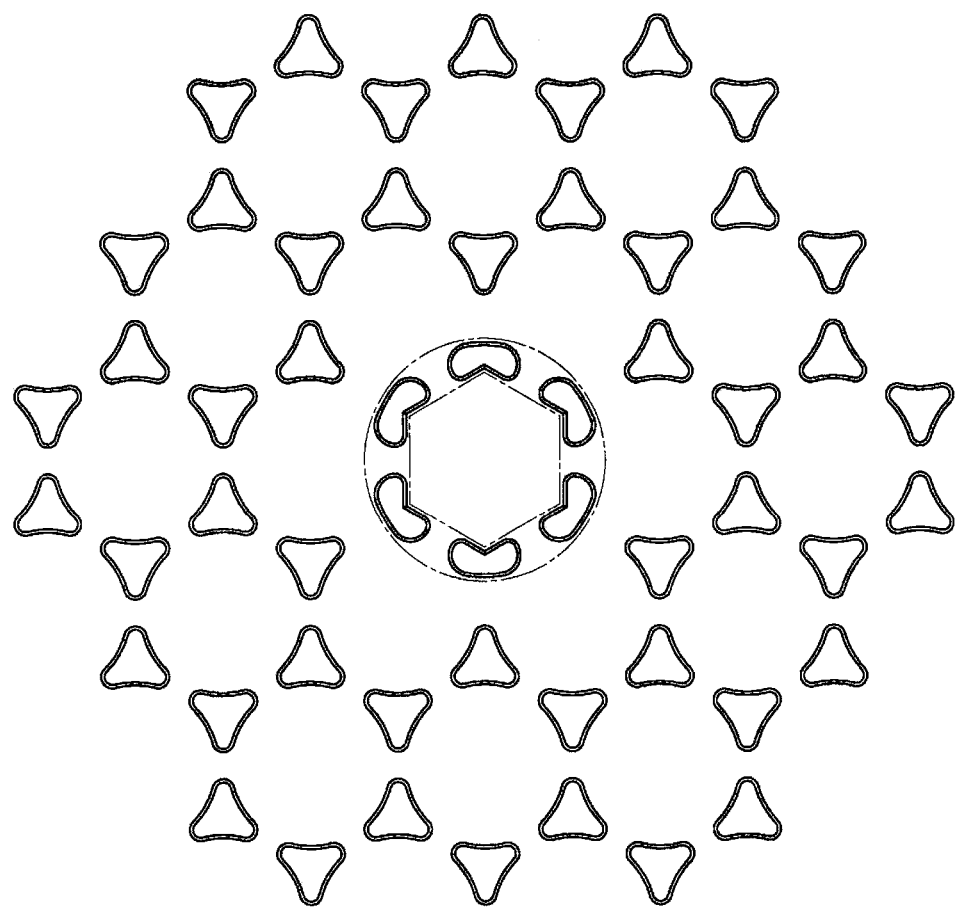
FIG. 14 is a partially enlarged schematic view of a center area of a heater block according to an embodiment.

Heater block as depicted in FIGS. 13 and 14

A schematic view of an embodiment of a heater block is shown in FIG. 13. Also, an enlarged schematic view of a center area of an embodiment of a heater block is shown in FIG. 14. The specific values used in the example are shown in parentheses.

In this example, configurations of an upper surface of a heater block are as follows:

Number of main concaves: selected from a range of about 300 to about 1000 (example: 650)

Main concave diameter: selected from a range of about 2 mm to about 20 mm (example: 9.0 mm)

Main concave depth: selected from a range of about 0.025 mm to about 15 mm (example: 0.15 mm)

Distance between main concave centers: selected from a range of about 5 mm to about 20 mm (example: 11.5 mm)

Channel width: selected from a range of about 1.0 to about 14 mm (example: 2.0 mm)

Channel depth: selected from a range of about 0.025 mm to about 15 mm (example: 0.2 mm)

Center concave size: maximum length from the center point selected from a range of about 2.0 to about 17 mm (example: 9.0 mm)

Center concave depth: selected from a range of about 0.025 mm to about 15 mm (example: 0.15 mm)

Shape of center concave: polygonal (example: hexagonal)

Shape of contour of outer sidewalls of convexes that define center concave: circular (example: circular)

Diameter of shape of contour of outer sidewalls of convexes that define center concave: selected from a range of about 3 mm to about 25 mm (example: 12 mm)

Width of channel from the center concave: selected from a range of about 1.0 mm to about 14 mm (example: 2.0 mm)

Depth of channel from the center concave: selected from a range of about 0.025 mm to about 15 mm (example: 0.2 mm)

Heater block material: aluminum (example: aluminum)

Heater block thickness: selected from a range of about 20 mm to about 120 mm (example: 45 mm)

Heater block diameter: selected from a range of about 295 mm to about 475 mm (example: 345 mm)

In this example, the concave or depression at the center has a hexagonal shape, and the contour of outer sidewalls of convexes that define the center concave or depression has a circular shape. In this way, the ATS could detect the center of a circular target substrate having a center concave of a hexagonal shape and the contour of a circular shape both of which functions as a clear mark that shows the center of the target substrate so that the ATS can successfully measure offsets from its center to the center of a target substrate on the heater block. It is also confirmed that this does not affect a quality of film formed on a substrate.

With respect to the use of substantially any plural and/or singular terms herein, those having skill in the art can translate from the plural to the singular and/or from the singular to the plural as is appropriate to the context.

Any discussion of the background art which has been included in the present disclosure is solely for the purpose of providing a context for the present invention, and it should not be taken as an admission that any or all of the discussion form part of the prior art or were known in the art at the time the invention was made.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A heater block adapted to be installed in a plasma deposition or plasma etching apparatus comprising a showerhead and a reaction chamber, the heater block adapted to be arranged in the reaction chamber to support a substrate and comprising:
   at least one through-hole passing through the heater block, and
   on its upper face, a plurality of surfaces separated from each other and defined by a continuous concavity, the continuous concavity comprising:
   a plurality of first convexes at least partly defining a plurality of main concaves or depressions,
   a concave channel connecting substantially every two adjacent main concaves or depressions,
   a plurality of second convexes at least partly defining a concave or depression, at the center of the heater block, of a different shape or size from the plurality of main concaves or depressions, wherein at least one first convex has a different shape from at least one second convex.

2. The heater block of claim 1, wherein the concave or depression at the center of the heater block has a cylindrical shape, a reversed cone shape without a tip or a polygonal columnar shape when viewed in three dimensions.

3. The heater block of claim 1, wherein the concave or depression at the center of the heater block has a cylindrical shape with a diameter selected from the range of about 2 millimeters to about 20 millimeters.

4. The heater block of claim 1, wherein the concave or depression at the center of the heater block is defined by inner sidewalls of the plurality of second convexes, and the contour of outer sidewalls of the plurality of second convexes has a circular or a polygonal shape.

5. The heater block of claim 1, wherein the plurality of main concaves or depressions and a plurality of the concave channels are defined by sidewalls of the plurality of first convexes.

6. The heater block of claim 1, wherein the pluralities of first and second convexes have sidewalls whose edges are rounded or chamfered with a radius selected from the range of about 0.1 millimeters to about 2 millimeters.

7. The heater block of claim 1, wherein the concave or depression at the center of the heater block is connected with adjacent main concaves or depressions via concave channels of a different shape or size from the concave channel connecting substantially every two adjacent main concaves or depressions.

8. The heater block of claim 1, wherein each of the main concaves or depressions has substantially the same shape and size.

9. The heater block of claim 1, wherein the at least one through-hole includes at least one through-hole used for a substrate lift pin.

10. A heater block adapted to be installed in a plasma deposition or plasma etching apparatus comprising a showerhead and a reaction chamber, the heater block adapted to be arranged in the reaction chamber to support a substrate and comprising:
at least one through-hole passing through the heater block, and
on its upper face, a plurality of surfaces separated from each other and defined by a continuous concavity, the continuous concavity comprising:
a plurality of first convexes at least partly defining a plurality of main concaves or depressions, and
a concave channel connecting substantially every two adjacent main concaves or depressions,
wherein a concave or depression at the center of the heater block is at least partly defined by inner sidewalls of a plurality of second convexes, and the contour of outer sidewalls of the plurality of second convexes has a circular or a polygonal shape, and
wherein at least one first convex has a different shape from at least one second convex.

11. A substrate processing apparatus comprising the heater block of claim 1.

12. The substrate processing apparatus of claim 11, wherein the substrate is supported substantially by the top face of the plurality of first and second convexes.

13. The substrate processing apparatus of claim 11, wherein the heater block comprises a susceptor and a heater.

14. A processing apparatus comprising:
a showerhead;
a reaction chamber; and
a heater block arranged in the reaction chamber, the heat block comprising:
at least one through-hole passing through the heater block, and
on its upper face, a plurality of surfaces separated from each other and defined by a continuous concavity, the continuous concavity comprising:
a plurality of first convexes at least partly defining a plurality of main concaves or depressions,
a concave channel connecting substantially every two adjacent main concaves or depressions, and
a plurality of second convexes at least partly defining a concave or depression, at the center of the heater block, of a different shape or size from the plurality of main concaves or depressions,
wherein at least one first convex has a different shape from at least one second convex.

15. The processing apparatus of claim 14, wherein the concave or depression at the center of the heater block has a cylindrical shape, a reversed cone shape without a tip or a polygonal columnar shape when viewed in three dimensions.

16. The processing apparatus of claim 14, wherein the concave or depression at the center of the heater block has a cylindrical shape with a diameter selected from the range of about 2 millimeters to about 20 millimeters.

17. The processing apparatus of claim 14, wherein the concave or depression at the center of the heater block is defined by inner sidewalls of the plurality of second convexes, and the contour of outer sidewalls of the plurality of second convexes has a circular or a polygonal shape.

18. The processing apparatus of claim 14, wherein the plurality of main concaves or depressions and a plurality of the concave channels are defined by sidewalls of the plurality of first convexes.

19. The processing apparatus of claim 14, wherein the processing apparatus is configured for deposition or etching of a material on a substrate.

20. The processing apparatus of claim 14, wherein the concave or depression at the center of the heater block is connected with adjacent main concaves or depressions via concave channels of a different shape or size from the concave channel connecting substantially every two adjacent main concaves or depressions.

* * * * *